US012666553B2

(12) United States Patent (10) Patent No.: US 12,666,553 B2
Liang (45) Date of Patent: Jun. 23, 2026

(54) ADVERTISING APPARATUS WITH FOLDABLE DISPLAY SCREENS

(71) Applicant: LINKSIGN TECHNOLOGY LIMITED, New York, NY (US)

(72) Inventor: Lihong Liang, Shenzhen (CN)

(73) Assignee: LINKSIGN TECHNOLOGY LIMITED, New York, NY (US)

( * ) Notice: Subject to any disclaimer, the term of this patent is extended or adjusted under 35 U.S.C. 154(b) by 0 days.

(21) Appl. No.: 19/250,780

(22) Filed: Jun. 26, 2025

(65) Prior Publication Data

US 2026/0122807 A1 Apr. 30, 2026

(30) Foreign Application Priority Data

Oct. 29, 2024 (CN) .......................... 202422614493.X

(51) Int. Cl.
*H05K 5/02* (2006.01)
*G09F 9/30* (2006.01)
*G09F 27/00* (2006.01)
(52) U.S. Cl.
CPC ............. *H05K 5/0226* (2013.01); *G09F 9/30* (2013.01); *G09F 27/00* (2013.01)
(58) Field of Classification Search
CPC ......... H05K 5/0226; G09F 9/30; G09F 9/301; G09F 9/302; G09F 9/3023; G09F 9/3026
See application file for complete search history.

(56) References Cited

U.S. PATENT DOCUMENTS

| | | | | |
|---|---|---|---|---|
| 8,104,204 B1 * | 1/2012 | Syrstad | ..................... | G09F 9/33 |
| | | | | 40/544 |
| 11,908,347 B2 * | 2/2024 | Zhao | ........................ | G09F 13/18 |
| 12,093,091 B1 * | 9/2024 | Martel | .................. | G09F 9/3026 |
| 2013/0269882 A1 * | 10/2013 | Bauman | .................. | E05D 11/10 |
| | | | | 16/221 |
| 2016/0179133 A1 * | 6/2016 | Hochman | ............... | G09F 9/301 |
| | | | | 345/1.3 |
| 2017/0031386 A1 * | 2/2017 | Engel | ..................... | F16M 11/42 |
| 2020/0043388 A1 * | 2/2020 | Hicks | ........................ | G09F 9/33 |
| 2020/0219424 A1 * | 7/2020 | Duarte | ................. | G09F 9/3026 |
| 2020/0256118 A1 * | 8/2020 | Hicks | ........................ | G09F 9/33 |
| 2021/0004194 A1 * | 1/2021 | Wickstrum | ............ | F16M 11/42 |
| 2021/0124543 A1 * | 4/2021 | Joo | ..................... | G06F 1/3265 |

(Continued)

*Primary Examiner* — Rockshana D Chowdhury
*Assistant Examiner* — Douglas R Burtner
(74) *Attorney, Agent, or Firm* — HOWARD M COHN and Associates, LLC

(57) ABSTRACT

An advertising apparatus convenient to transport is provided, including a first display screen, a second display screen, at least one hinge, and at least one locking component. The first display screen and the second display screen are rotatably connected through the at least one hinge to allow flattening or folding with respect to each other. The at least one locking component includes a connecting hook and a locking rod. The connecting hook is rotatably connected to the first display screen. The connecting hook includes a rotation driving portion, and the rotation driving portion is exposed from a frame body of the first display screen. The locking rod is disposed at the second display screen. Both the connecting hook and the locking rod are positioned at corresponding junction areas between the first display screen and the second display screen.

11 Claims, 6 Drawing Sheets

(56)  References Cited

U.S. PATENT DOCUMENTS

| 2022/0240676 A1* | 8/2022 | Purton | G09F 9/3026 |
| 2023/0005396 A1* | 1/2023 | Djelloul | G09F 15/0062 |
| 2024/0218960 A1* | 7/2024 | Liu | F16M 11/2014 |
| 2025/0040069 A1* | 1/2025 | Duan | H05K 5/0226 |
| 2025/0306643 A1* | 10/2025 | Kim | G06F 1/1656 |

* cited by examiner

ADVERTISING APPARATUS WITH FOLDABLE DISPLAY SCREENS

TECHNICAL FIELD

The present disclosure relates to the field of advertising apparatuses, and in particular to an advertising apparatus convenient to transport.

BACKGROUND

To enhance transportability, conventional technologies, such as a multi-purpose LED display advertising apparatus disclosed in Chinese Patent Application No. 202311207941.8, provide foldable and self-locking hinge assemblies to hinge and fold/unfold an upper display unit and a lower display unit.

However, each of the foldable and self-locking hinge assemblies includes numerous components with complex structures. From a mechanical perspective, such foldable and self-locking hinge assemblies are prone to malfunction. Specifically, handle switches, multiple sets of engagement slots, rotating holes, and ear plates of each of the foldable and self-locking hinge assemblies form a structure similar to a cam mechanism, which requires overcoming rotational dead points and counteracting an elastic force of tension springs, thereby leading to unsmooth relative rotation between the upper display unit and the lower display unit. Furthermore, reliance on frictional force and spring tension to maintain predetermined angles results in poor stability. After repeated use, fatigue damage is easy to occur, causing difficulties in folding/unfolding operations and necessitating frequent hinge assembly replacements for maintenance.

SUMMARY

The present disclosure mainly aims at above problems, and provides an advertising apparatus convenient to transport, which aims to solve technical problems in the background art.

In order to achieve above aims, the present disclosure provides a first embodiment of the advertising apparatus convenient to transport, including a first display screen, a second display screen, at least one hinge, and at least one locking component. The first display screen and the second display screen are rotatably connected through the at least one hinge to allow flattening or folding with respect to each other. The at least one locking component includes a connecting hook and a locking rod. The connecting hook is rotatably connected to the first display screen. The connecting hook includes a rotation driving portion, and the rotation driving portion is exposed from a frame body of the first display screen. The locking rod is disposed at the second display screen. Both the connecting hook and the locking rod are positioned at corresponding junction areas between the first display screen and the second display screen. When the first display screen and the second display screen are rotated to a flattened state, the connecting hook at the first display screen locks the locking rod at the second display screen to maintain the first display screen and the second display screen in the flattened state.

Furthermore, the at least one locking component further includes a first supporting housing and a second supporting housing. The connecting hook is disposed in an inner cavity of the first supporting housing and is rotatably connected to the first supporting housing. The rotation driving portion is exposed from the first supporting housing. The locking rod is disposed in an inner cavity of the second supporting housing. Mounting positions for accommodating the first supporting housing and the second supporting housing are respectively disposed at the corresponding junction areas between the first display screen and the second display screen.

Furthermore, the advertising apparatus further includes at least one deployment retaining component. When the first display screen and the second display screen are rotated to the flattened state, a first end of the at least one deployment retaining component is rotatably abutted against the first display screen, and a second end of the at least one deployment retaining component is rotatably abutted against the second display screen.

Furthermore, the advertising apparatus further includes at least one magnetic component, the at least one magnetic component is disposed at least one of the first display screen and the second display screen, when the first display screen and the second display screen are rotated to a folded state, the at least one magnetic component is configured to perform magnetic attraction to maintain the first display screen and the second display screen in the folded state.

Furthermore, each of the first display screen and the second display screen includes a display panel, a middle frame, side trim panels, and a rear cover plate. In each of the first display screen and the second display screen, the display panel includes display panel units, the display panel units are assemblable and arranged on a first end surface of the middle frame, the rear cover panel is connected to a second end surface of the middle frame, the side trim panels enclose the display panel and the middle frame and are connected to side edges of the display panel and side edges of the middle frame, the middle frame include connecting positions, and the display panel units are detachably connected to the middle frame through corresponding connecting positions.

Furthermore, at least one wiring hole is defined on a frame body of the middle frame at a rotating connection side portion of each of the first display screen and the second display screen.

Furthermore, in each of the first display screen and the second display screen, the side trim panels are detachably connected to the middle frame, at least one mounting position for accommodating the at least one locking component respectively disposed at a left side of the middle frame or a right side of the middle frame.

Furthermore, in each of the first display screen and the second display screen, alignment components and docking positions matching the alignment components are respectively disposed at least one of a left side of the middle frame, a right side of the middle frame, and the corresponding junction areas between the first display screen and the second display screen.

Furthermore, the first alignment components and the second alignment component are ball plungers or spring pins. The first docking positions and the second docking positions are grooves or holes corresponding to the ball plungers or the spring pins.

Furthermore, a bottom base is disposed at one end of the second display screen opposite to the first display screen, a width of the bottom base does not exceed both widths of the first display screen and the second display screen.

Furthermore, the bottom base is detachably connected to the second display screen. The bottom base includes caster wheels at a lower end thereof. A housing of the bottom base internally includes a speaker, a power board, an amplifier, and a display control card. The bottom base further includes acoustic vents corresponding to the speaker and an interface mounting plate.

Furthermore, a damping component is disposed at a rotatable connection between the connecting hook and the first supporting housing.

The present disclosure further provides a second embodiment of the advertising apparatus convenient to transport, including the first display screen, the second display screen, and the at least one hinge. The first display screen and the second display screen are rotatably connected through the at least one hinge to allow flattening or folding with respect to each other. Each of the first display screen and the second display screen includes the display panel, the middle frame, joints, and the side trim panels. The joints are respectively disposed at lateral sides of each of the first display screen and the second display screen, the locking component is disposed at each of the joints, and each locking component includes the connecting hook and the locking rod. Each connecting hook and a corresponding locking rod are disposed in a corresponding one of the first display screen and the second display screen. Each connecting hook is rotatably connected to the corresponding one of the first display screen and the second display screen. Each connecting hook includes the rotation driving portion, and the rotation driving portion is exposed from a frame body of the corresponding one of the first display screen and the second display screen. The advertising apparatus is lockably connected to another advertising apparatus by engaging the connecting hook thereof with the locking rod of another advertising apparatus to maintain a flattened configuration therebetween.

Furthermore, the advertising apparatus further includes the at least one reinforcing plate and the rear cover plate, in each of the first display screen and the second display screen, the display panel includes the display panel units, the display panel units are assemblable and arranged on the first end surface of the middle frame, the rear cover panel is connected to the second end surface of the middle frame, the side trim panels enclose the display panel, the middle frame, and the rear cover plate and are connected to the side edges of the display panel, the side edges of the middle frame, and side edges of the rear cover plate, the middle frame includes connecting positions, and the display panel units are detachably connected to the middle frame through corresponding connecting positions, in at least one of the first display screen and the second display screen, the at least one reinforcing plate is connected to the middle frame, the side trim panels, and the rear cover plate, the bottom base is disposed at one end of the second display screen opposite to the first display screen, and the second display screen is detachably connected to the bottom base.

The present disclosure further provides a third embodiment of the advertising apparatus convenient to transport, including the first display screen, the second display screen, and the at least one hinge. The first display screen and the second display screen are rotatably connected through the at least one hinge to allow flattening or folding with respect to each other. Each of the first display screen and the second display screen includes the display panel, the middle frame, the joints, and the side trim panels. In each of the first display screen and the second display screen, the joints are respectively disposed on side surfaces of the middle frame, alignment components and docking positions are respectively disposed at two sides of the middle frame. The alignment components of the advertising apparatus are engaged with the docking positions of another advertising apparatus to achieve positioning and connection. Each of the joints of the advertising apparatus is locked with a corresponding one of the joints of another advertising apparatus to maintain a flattened configuration therebetween.

Furthermore, the alignment components are ball plungers or spring pins. The docking positions are grooves or holes corresponding to the ball plungers or the spring pins.

Furthermore, a locking component is disposed at each of the joints, each locking component includes a connecting hook and a locking rod. Each connecting hook is rotatably connected to the first display screen. Each connecting hook includes the rotation driving portion, and each rotation driving portion is exposed from a frame body of the first display screen. Each locking rod is disposed at the second display screen. Each connecting hook and a corresponding locking rod are positioned at the corresponding junction areas between the first display screen and the second display screen. When the first display screen and the second display screen are rotated to a flattened state, each connecting hook at the first display screen locks the corresponding locking rod at the second display screen to maintain the first display screen and the second display screen in the flattened state.

Furthermore, each of the first display screen and the second display screen includes the rear cover plate. In each of the first display screen and the second display screen, the display panel includes the display panel units, the display panel units are assemblable and arranged on the first end surface of the middle frame, the rear cover panel is connected to the second end surface of the middle frame, the side trim panels enclose the display panel and the middle frame and are connected to the side edges of the display panel and the side edges of the middle frame, the middle frame includes the connecting positions, and the display panel units are detachably connected to the middle frame through corresponding connecting positions.

Compared with the prior art, the advertising apparatus of the present disclosure provides the mounting positions respectively in the first display screen and the second display screen to conceal each locking component to improve an overall aesthetic appearance thereof. At the same time, each rotation driving portion is prevented from being accidentally operated to rotate by others, such as randomly turning, so as to avoid subsequent locking failure. Through the use of each locking component, the first display screen and the second display screen of the advertising apparatus are maintained in the flattened state. Additionally, the use of simple, widely available hinges as each hinge of the present disclosure for rotational connection ensures structural stability, ease of operation, and low manufacturing costs. Such design makes the advertising apparatus easy to operate, simple to manufacture, stable in operation, and durable, while also reducing maintenance requirement.

Figure 1:
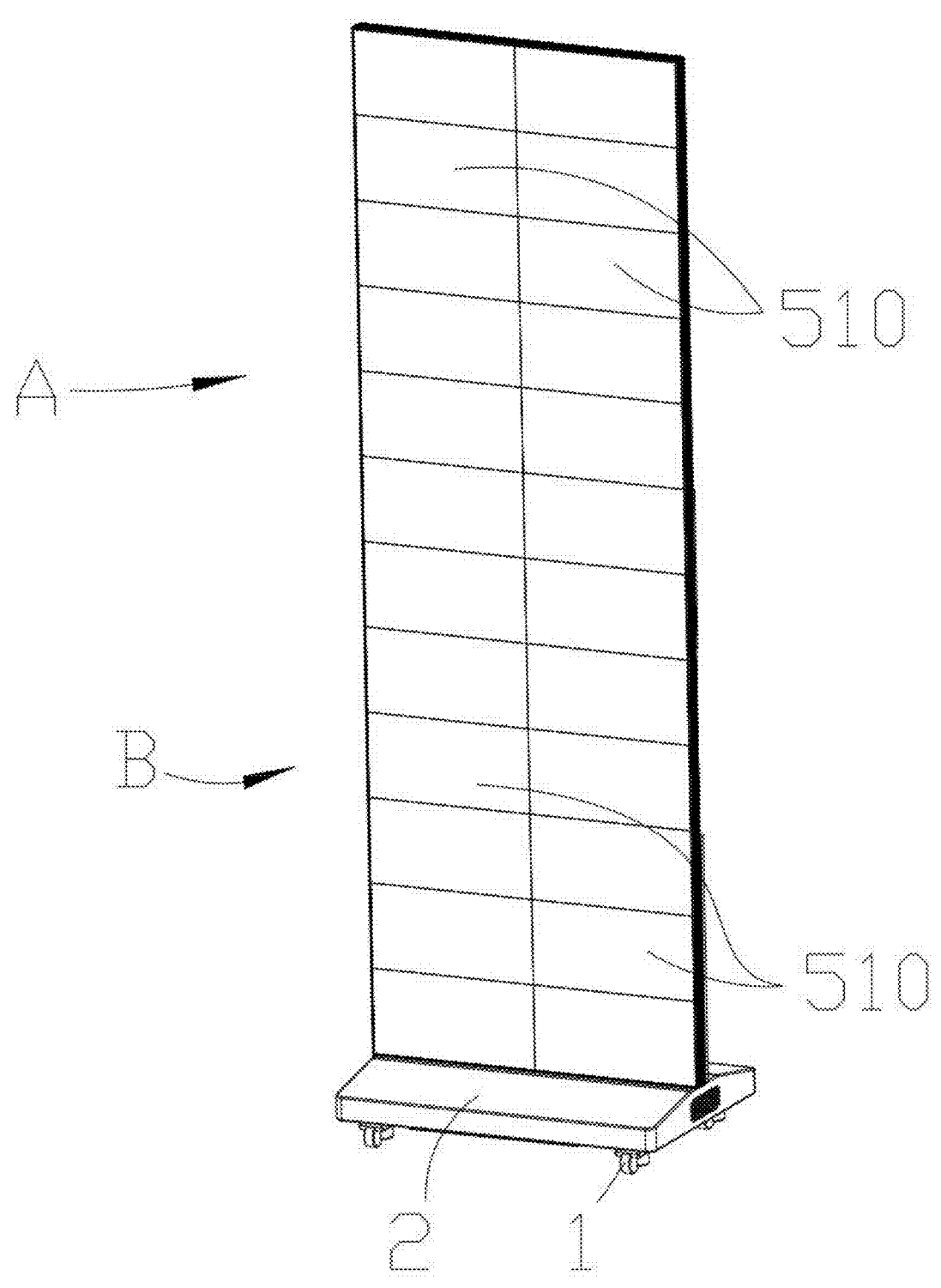
FIG. 1 is a structural schematic diagram of an advertising apparatus convenient to transport according to the present disclosure.

Reference numerals in the drawings: 1. caster wheel; 2. bottom base; 2010. upper housing; 2011. acoustic vent; 2020. bottom plate; 3. speaker; 4. first display receiving card; 5. display panel; 510. display panel unit; 6. mounting plate; 7. middle frame; 710. connecting position; 720. wiring hole; 8. left side trim panel; 9. top trim panel; 11. right side trim panel; 12. rear cover plate; 13. locking component; 1301. first supporting housing; 1302. second supporting housing; 1303. connecting hook; 1304. locking rod; 1305. rotation driving portion; 14. deployment retaining component; 15. hinge; 16. reinforcing plate; 1610. accommodating groove; 17. alignment component; 1701. docking position; 18. interface mounting plate; 19. power board; 20. amplifier; 21. display control card; 22. second display receiving card; 23. magnetic component; 24. mounting position; 25. joint; A. first display screen; B. second display screen.

DETAILED DESCRIPTION OF EMBODIMENTS

Technical solutions in embodiments of the present disclosure are clearly and completely described below with reference to accompanying drawings in the embodiments of the present disclosure, and obviously, the described embodiments are only a part but not all of the embodiments of the present disclosure. All other embodiments obtained by those who skilled in the art based on the embodiments of the present disclosure without creative efforts shall fall within a protection scope of the present disclosure. It should be understood that the drawings are only provided with reference and description, and are not intended to limit the present disclosure. Connection relationship shown in the accompanying drawings is merely for ease of clear description, and does not limit a connection manner.

It should be noted that when one component is considered to be "connected to" another component, it may be directly connected to another component, or a centering component may exist at the same time. Unless otherwise defined, all technical and scientific terms used herein have the same meaning as commonly understood by those who skilled in the art. It should also be noted that, unless expressly specified and limited otherwise, terms "mounted", "connected with", and "connected to" should be understood in a broad sense, for example, may be a fixed connection, a detachable connection, or an integral connection; and may be a mechanical connection or an electrical connection, and may be a communication inside two components. For those who skilled in the art, specific meanings of the above terms in the present disclosure may be understood according to specific situations. Terms used in the specification of the present disclosure are merely for a purpose of describing specific embodiments, and are not intended to limit the present disclosure.

It should also be noted that, in the description of the present disclosure, orientation or position relationship indicated by terms "center", "upper", "lower", "left", "right", "vertical", "horizontal", "inner", "outer", etc. are based on orientation or position relationships shown in the accompanying drawings, rather than indicating or implying that a device or element has to have a specific orientation or be constructed and operated in a specific orientation, and therefore cannot be understood as a limitation to the present disclosure. In addition, terms "first", "second" and "third" are used for descriptive purposes only and cannot be understood as indicating or implying relative importance.

Please refer to FIGS. 1-6, the embodiments of the present disclosure provide an advertising apparatus convenient to transport, including a first display screen A, a second display screen B, at least one hinge 15, and at least one locking component 13. The first display screen A and the second display screen B are rotatably connected through the at least one hinge 15; when the first display screen A and the second display screen B are in an flattened state, a display surface of the first display screen A and a display surface of the second display screen B lie in the same plane, so that a display area of the advertising apparatus is larger; when the first display screen A and the second display screen B are in a folded state, outer contours of the two coincide, so as to facilitate transportation of the advertising apparatus. Compared with conventional advertising apparatuses, a packaging volume of the advertising apparatus of the present disclosure is reduced and the advertising apparatus of the present disclosure is also functioned as a double-sided advertising apparatus.

It should be noted that the first display screen A and the second display screen B are rotatably unfolded with respect to each other, the display surface of the first display screen A and the display surface of the second display screen B are designed to lie in the same plane, though in practice, the display surface of the first display screen A and the display surface of the second display screen B approximately lie in the same plane due to manufacturing and assembly tolerances, it is difficult to achieve perfect alignment without any error. Therefore, the description of the display surfaces lying in the same plane when unfolded represents an ideal state used to describe their positional relationship. Similarly, when the first display screen A and the second display screen B are in the folded state, the outer contours of the two approximately coincide.

In some embodiments, the at least one locking component 13 includes a connecting hook 1303 and a locking rod 1304. The connecting hook 1303 is rotatably connected to the first display screen A. The connecting hook 1303 includes a rotation driving portion 1305, and the rotation driving portion 1305 is exposed from a frame body of the first display screen A. The locking rod 1304 is disposed at the second display screen B.

In some embodiments, the at least one locking component 13 includes a first supporting housing 1301, a second supporting housing 1302, a connecting hook 1303, and a locking rod 1304. The connecting hook 1303 is disposed in an inner cavity of the first supporting housing 1301 and is rotatably connected to the first supporting housing 1301. A damping component (not shown in the drawings) is disposed at a rotatable connection between the connecting hook 1303 and the first supporting housing 1301. The connecting hook 1303 includes the rotation driving portion 1305, and the rotation driving portion 1305 is exposed from the first supporting housing 1301.

In some embodiments, the rotation driving portion 1305 is an internal hexagonal socket, the internal hexagonal socket is operated by an external hexagonal wrench to drive the connecting hook 1303 to rotate with respect to the first supporting housing 1301.

The locking rod is disposed in an inner cavity of the second supporting housing 1302. Mounting positions 24 for accommodating the first supporting housing 1301 and the second supporting housing 1302 are respectively disposed at corresponding junction areas between the first display screen A and the second display screen B. When the first display screen A and the second display screen B are rotated to a flattened state, the connecting hook 1303 at the first display screen A locks the locking rod 1304 at the second display screen B to maintain the first display screen A and the second display screen B in the flattened state.

The first supporting housing 1301 and the second supporting housing 1302 are respectively connected to the connecting hook 1303 and the locking rod 1304, so that the at least one locking component forms a standardized structural component, which is convenient for mounting, maintenance, replacement, and further enables easy connection with corresponding mounting positions 24.

By providing the damping component to enhance a rotational friction between the connecting hook 1303 and the first supporting housing 1301, the connecting hook 1303 is fixed with respect to the first supporting housing 1301 when a rotational force on the rotation driving portion 1305 is stopped. Due to rotatable connection between the connecting hook 1303 and the first supporting housing 1301, even if the damping component eventually experiences fatigue failure, as long as the connecting hook 1303 is rotated to extend into the inner cavity of the second supporting housing 1302 to hook and lock the locking rod 1304, connection between the connecting hook 1303 and the locking rod 1304 remains stable without disengaging, even without manually turning the rotation driving portion 1305 with a tool, which maintains the first display screen and the second display screen in the flattened state.

The mounting positions 24 respectively in the first display screen A and the second display screen B to conceal the at least one locking component 13 to improve an overall aesthetic appearance of the advertising apparatus. At the same time, the rotation driving portion 1305 is prevented from being accidentally operated to rotate by others, such as randomly turning, so as to avoid subsequent locking failure.

Through the use of the at least one locking component 13, the first display screen A and the second display screen B of the advertising apparatus are maintained in the flattened state. Additionally, the use of simple, widely available hinges as the at least one hinge 15 of the present disclosure for rotational connection ensures structural stability, ease of operation, and low manufacturing costs. Such design makes the advertising apparatus easy to operate, simple to manufacture, stable in operation, and durable, while also reducing maintenance requirement.

A relative positional relationship between the connecting hook 1303 and the at least one hinge 15 is as follows.

A virtual plane formed by rotation of the connecting hook 1303 is preferably perpendicular to a virtual plane formed by rotation of the first display screen A with respect to the second display screen B through the at least one hinge 15. In this way, when the connecting hook 1303 hooks and locks onto the locking rod 1304, disengagement is not likely to easily occur.

Figure 2:
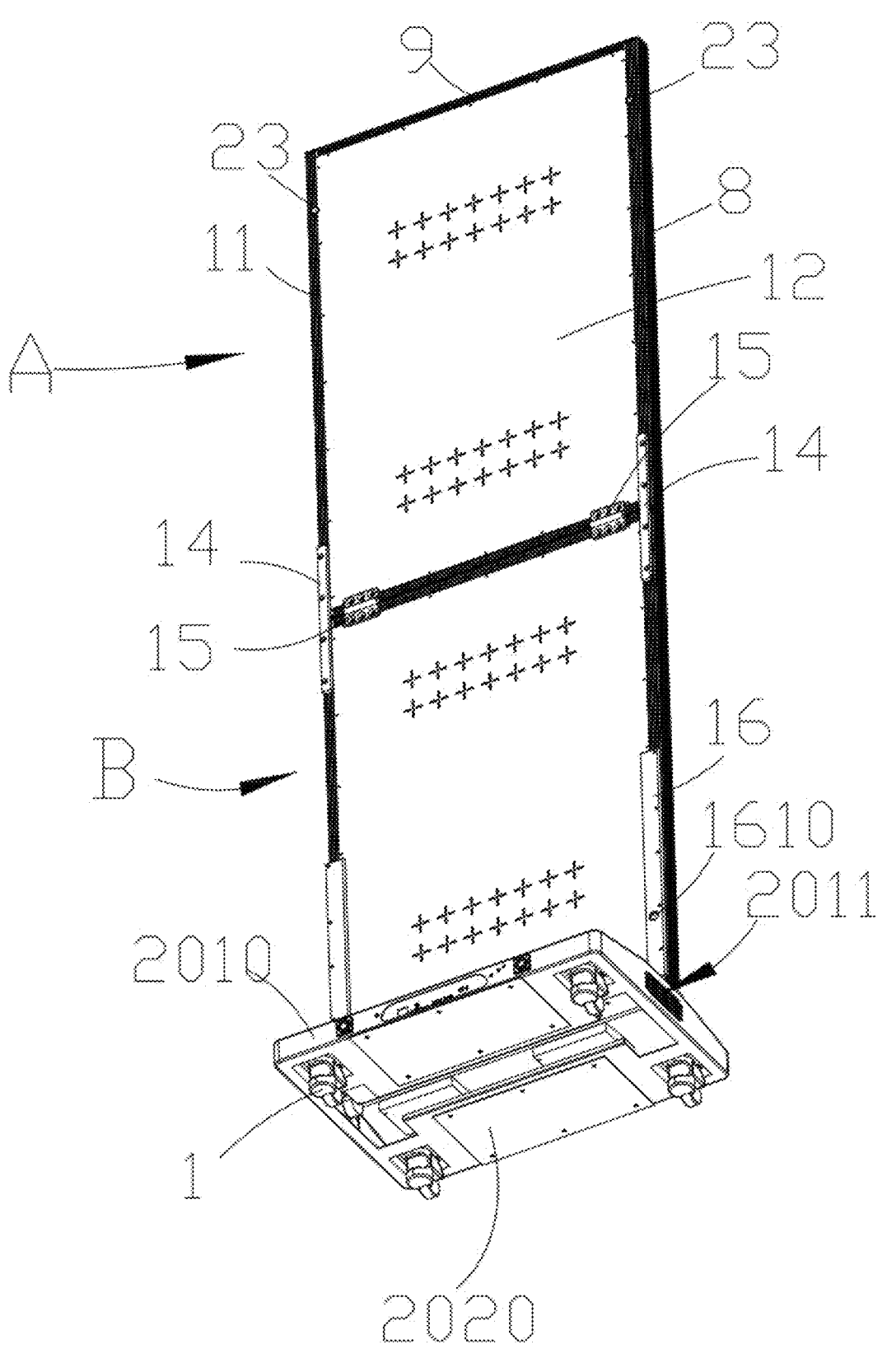
FIG. 2 is another structural schematic diagram of the advertising apparatus according to the present disclosure.
Figure 3:
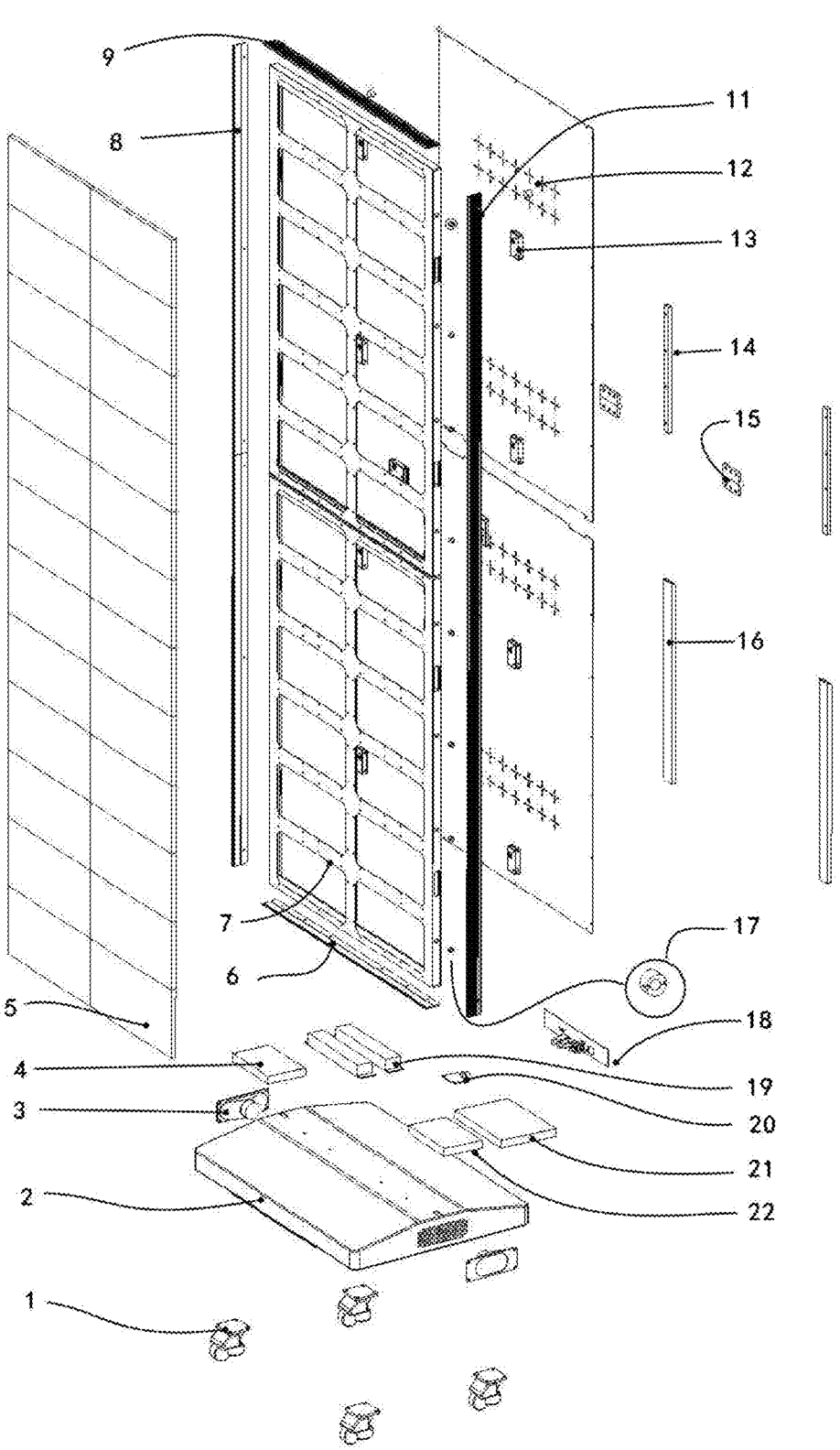
FIG. 3 is an exploded structural schematic diagram of the advertising apparatus according to the present disclosure.

As shown in FIGS. 2-3, the advertising apparatus further includes at least one deployment retaining component 14. When the first display screen A and the second display screen B are rotated to the flattened state, a first end of the at least one deployment retaining component 14 is rotatably abutted against the first display screen A, and a second end of the at least one deployment retaining component 14 is rotatably abutted against the second display screen B.

In some embodiments, the at least one deployment retaining component 14 is a profiled plate with one flat end face, and the at least one deployment retaining component 14 is connected to the first display screen A and the second display screen B through bolts for removable attachment.

Figure 6:
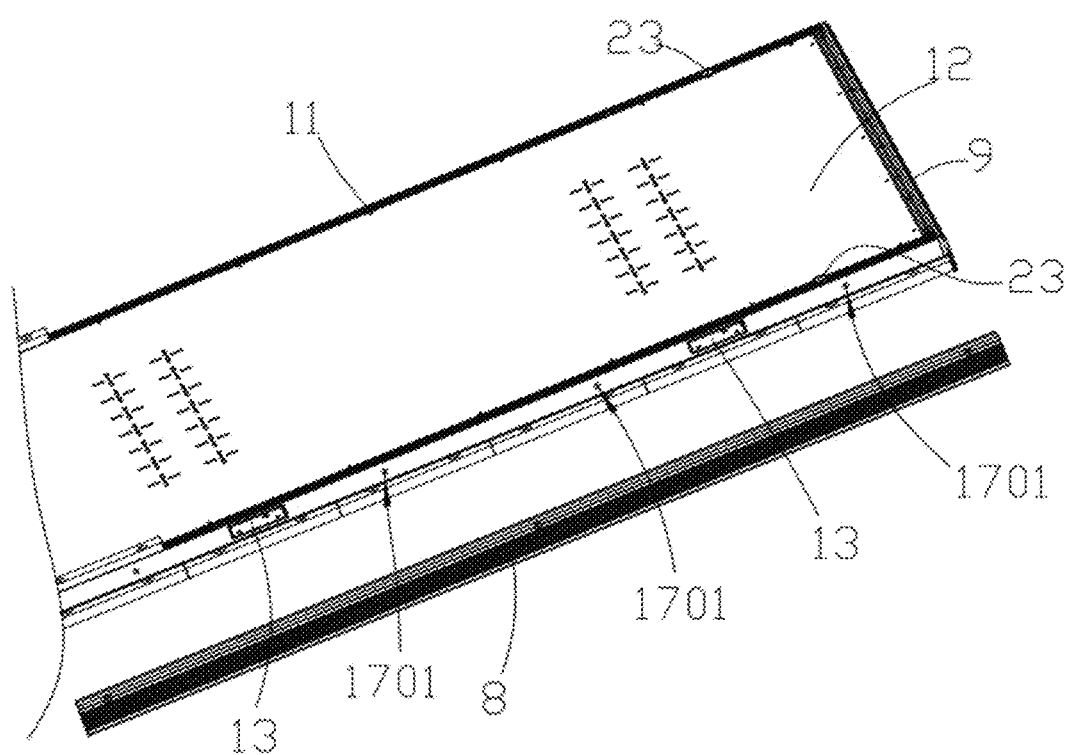
FIG. 6 is a partial exploded structural schematic diagram of the advertising apparatus according to the present disclosure.
Figure 7:
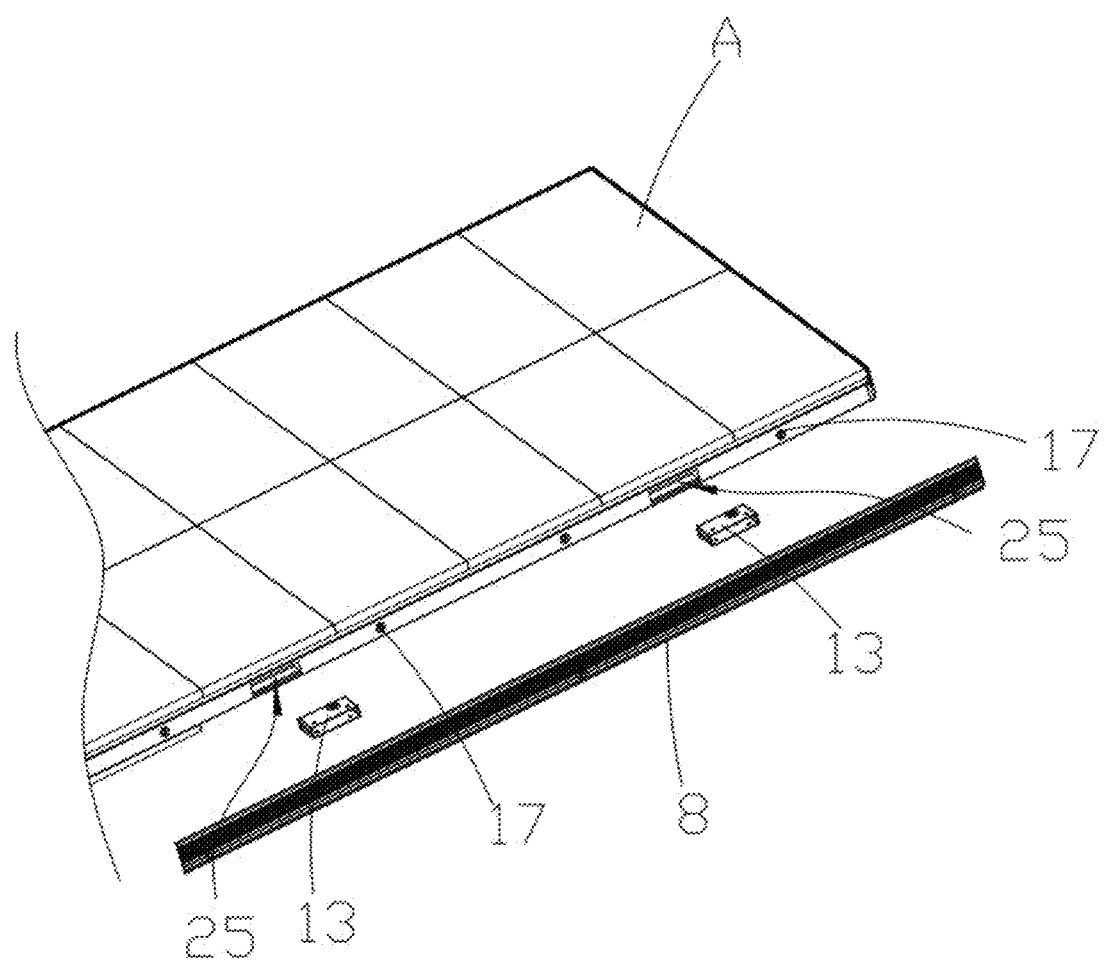
FIG. 7 is another partial exploded structural schematic diagram of the advertising apparatus according to the present disclosure.

Please refer to FIGS. 2 and 6, the advertising apparatus further includes at least one magnetic component 23, the at least one magnetic component 23 is disposed at least one of the first display screen A and the second display screen B, when the first display screen A and the second display screen B are rotated to a folded state, the at least one magnetic component 23 is configured to perform magnetic attraction to maintain the first display screen A and the second display screen B in the folded state.

In some embodiments, the at least one magnetic component 23 is a magnet and is disposed in one side of a middle frame 7 close to a rear cover plate 12 of the first display screen A, and at least one reinforcing plate 16 connected to the second display screen B defines an accommodating groove 1610 corresponding to the magnet, so that when the first display screen A and the second display screen B are in the folded state, the at least one magnetic component 23 is prevented from abutting against an outer wall, resulting in a gap.

Please refer to FIGS. 1-4 and 6, the advertising apparatus further includes the at least one reinforcing plate 16. Each of the first display screen A and the second display screen B includes a display panel 5, the middle frame 7, side trim panels, and the rear cover plate 12.

In each of the first display screen A and the second display screen B, the side trim panels include a left side trim panel 8, a right side trim panel 11, the left side trim panel 8 and the right side trim panel 11 are respectively disposed at a left side and a right side of the middle frame 7. In the first display screen A, the side trim panels further include a top trim panel 9, the top trim panel 9 is disposed at a top edge of the middle frame 7. In the second display screen B, the side trim panels further include a mounting plate 6, the mounting plate 6 is disposed at a bottom edge of the middle frame 7, at least one threaded connecting hole is defined on the mounting plate 6, and the at least one threaded connecting hole is configured to connect to a bottom base 2.

In each of the first display screen A and the second display screen B, the display panel 5 includes display panel units 510, the display panel units 510 are assemblable and arranged on a first end surface of the middle frame 7, the rear cover panel 12 is connected to a second end surface of the middle frame 7, the side trim panels enclose the display panel 5, the middle frame 7, and the rear cover plate 12 and are connected to side edges of the display panel 5, side edges of the middle frame 7, and side edges of the rear cover plate 12, the middle frame 7 includes connecting positions 710, and the display panel units 510 are detachably connected to the middle frame 7 through corresponding connecting positions 710. In at least one of the first display screen A and the second display screen B, the at least one reinforcing plate 16 is connected to the middle frame 7, the side trim panels, and the rear cover plate 12.

In some embodiments, two reinforcing plates 16 are provided, and the two reinforcing plates 16 are specifically connected to the middle frame 7, the left side trim panel 8, the right side trim panel, and the rear cover plate 12 of the second display screen B.

In some other embodiments, the two reinforcing plates 16 are also connected to the middle frame 7, the left side trim panel 8, the right side trim panel, and the rear cover plate 12 of the first display screen A.

The two reinforcing plates 16 are profiled plates.

In each of the first display screen A and the second display screen B, the display panel units 510 of the display panel 5 is capable of being individually replaced by detaching from the corresponding connecting positions 710, which is convenient for maintenance. In some embodiments, the mid frame 7 defines screw connecting holes (i.e., the connecting positions 710) only along perimeter edges corresponding to the display panel units 510, while the rest of the mid frame is perforated with open holes.

In some embodiments, in each of the first display screen A and the second display screen B, the back cover plate 12 defines air-permeable heat dissipation holes.

The frame body of the first display screen A at least includes the middle frame 7. In the first display screen A, after the rear cover plate 12 is connected to the middle frame 7, the at least one locking component 13 is concealed to prevent the rotation driving portion 1305 from being exposed.

Figure 4:
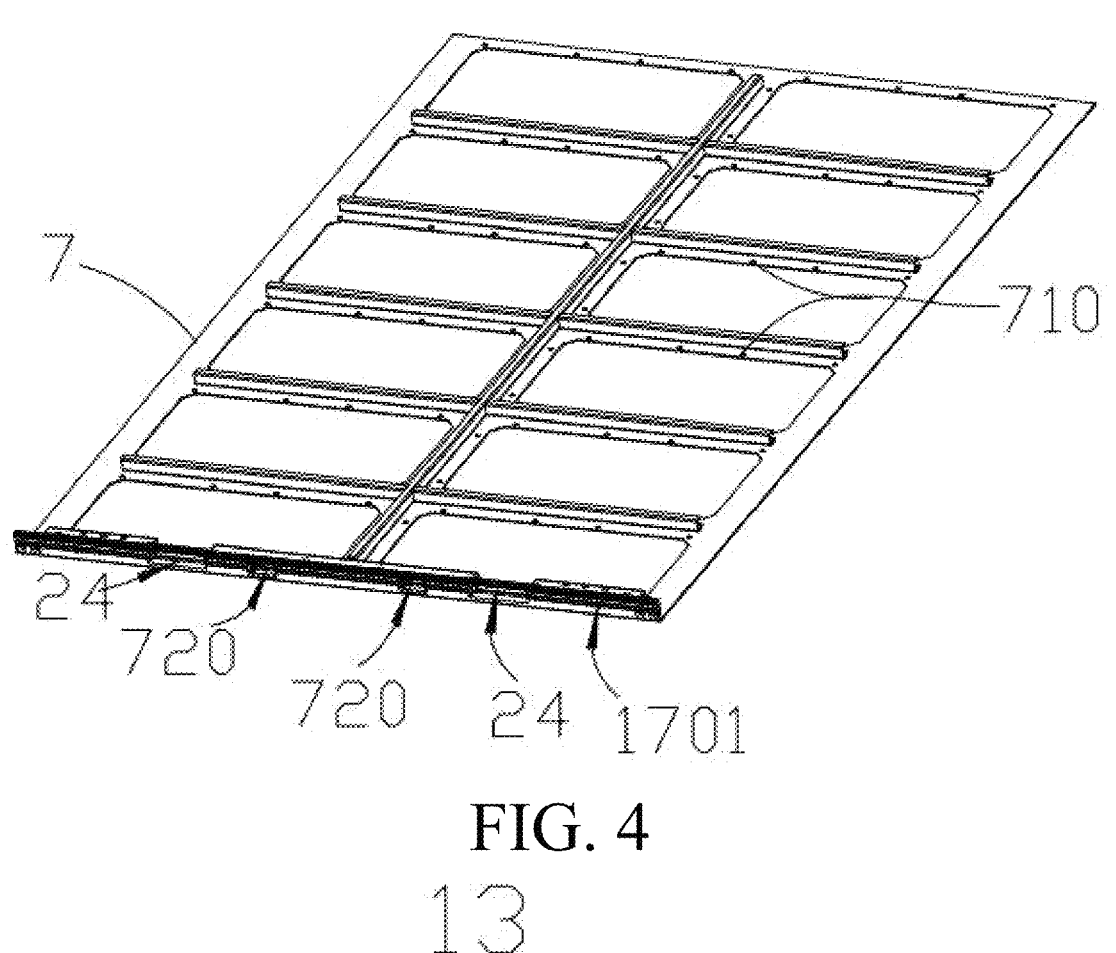
FIG. 4 is a structural schematic diagram of a middle frame of the advertising apparatus according to the present disclosure.
Figure 5:
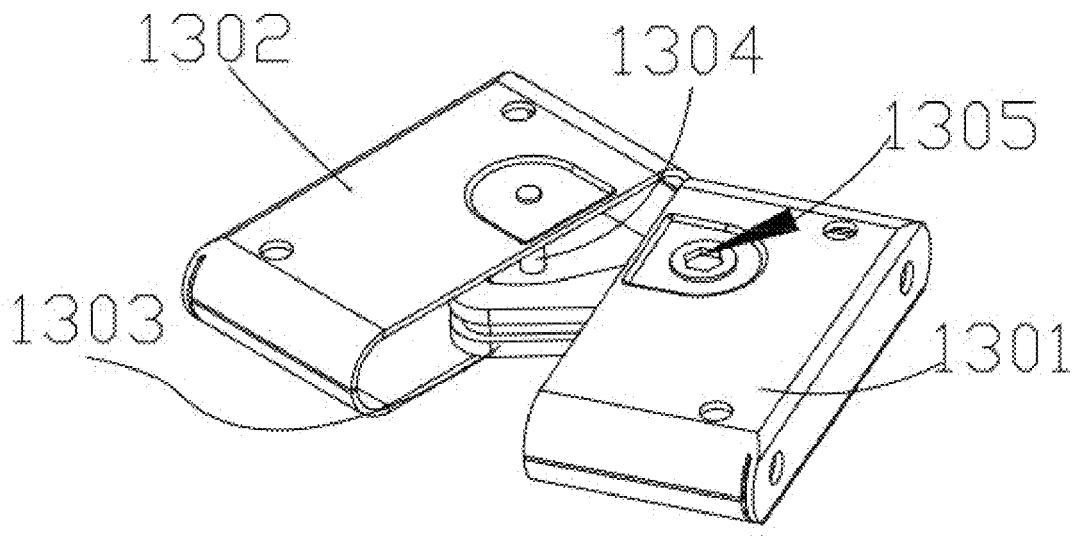
FIG. 5 is a structural schematic diagram of a locking component of the advertising apparatus according to the present disclosure.

Please refer to FIG. 4, at least one wiring hole 720 is defined on a frame body of the middle frame 7 at a rotating connection side portion of each of the first display screen A and the second display screen B. The display panel 5 of the first display screen A transmits a video data signal and supplies power through at least one cable passing through the at least one wiring hole 720.

In some embodiments, please refer to FIGS. 3 and 6, in each of the first display screen A and the second display screen B, the left side trim panel 8 and the right side trim panel 11 are detachably connected to the middle frame 7. The mounting positions for accommodating the first supporting housing 1301 and the second supporting housing 1302 are respectively disposed at the left side and the right side of the middle frame 7.

A width of the bottom base 2 does not exceed both widths of the first display screen A and the second display screen B.

With such design, a plurality of advertising apparatuses are horizontally arranged side by side and connected as a single unit through corresponding locking components 13, so as to form a larger display.

Please refer to FIGS. 3 and 6, in each of the first display screen A and the second display screen B, alignment components 17 and docking positions 1701 matching the alignment components 17 are respectively disposed at the left side and the right side of the middle frame 7; and/or, the alignment components 17 and the docking positions 1701 matching the alignment components 17 are respectively disposed at the corresponding junction areas between the first display screen A and the second display screen B.

In some embodiments, the first alignment components 17 and the second alignment component are ball plungers. The first docking positions 1701 and the second docking positions are grooves corresponding to ball portions of the ball plungers.

When the first display screen A and the second display screen B are rotated to align and seamlessly connect, or when the plurality of the advertising apparatuses are horizontally arranged side by side and connected as the single unit through the corresponding locking components 13, alignment accuracy is ensured for a smooth connection and better continuity of a displayed image. This is achieved through use of the ball plungers that fit into the grooves corresponding to the ball portions thereof. If one of the ball plungers does not fall into a corresponding groove, a corresponding one of the ball portions presses against a side wall of an adjacent advertising apparatus, creating a gap that is easy to identify, so as to inform installation personnel to promptly makes adjustments. Additionally, since each of the ball portions is spherical and each of the ball plungers includes an internal spring, adjacent advertising apparatuses are prevented from suffering from surface scratches during an alignment process.

Please refer to FIGS. 2 and 3, the bottom base 2 is disposed at one end of the second display screen B opposite to the first display screen A. The bottom base 2 includes an upper housing 2010 and a bottom plate 2020. The bottom plate 2020 and the upper housing 2010 are enclosed to form a housing inner cavity.

The second display screen B is detachably connected to the bottom base 2 through the mounting plate 6. The bottom base 2 includes caster wheels 1 at a lower end thereof. A housing of the bottom base 2 internally includes a speaker 3, a first display receiving card 4, a power board 19, an amplifier 20, a display control card 21, and a second display receiving card 22. The bottom base 2 further includes acoustic vents 2011 corresponding to the speaker 3 and an interface mounting plate 18.

The acoustic vents 2011 are respectively defined on a left side wall and a right side wall of the upper housing 2010.

The interface mounting plate 18 is configured to fix video input interfaces, power supply interfaces, and data transmission interfaces.

Further, the caster wheels 1 are height-adjustable, allowing for fine adjustments in height when aligning the plurality of the advertising apparatuses during installation.

It is should be noted that a structure of the advertising apparatus of the present disclosure is not limited to vertically connecting the first display screen A and the second display screen B; similarly, the plurality of the advertising apparatuses are not restricted to horizontal alignment. The first display screen A and the second display screen B, using the same structural principle, are also capable of being horizontally aligned, and the plurality of the advertising apparatuses are also capable of being vertically connected.

Please refer to FIGS. 1-7, the present disclosure further provides a second embodiment of the advertising apparatus convenient to transport, including the first display screen A, the second display screen B, and the at least one hinge 15. The first display screen A and the second display screen B are rotatably connected through the at least one hinge 15 to allow flattening or folding with respect to each other. Each of the first display screen A and the second display screen B includes the display panel 5, the middle frame 7, joints 25, and the side trim panels. The joints 25 are respectively disposed at lateral sides of each of the first display screen A and the second display screen B, the locking component 13 is disposed at each of the joints 25, and each locking component 13 includes the connecting hook 1303 and the locking rod 1304. Each connecting hook 1303 and a corresponding locking rod 1304 are disposed in a corresponding one of the first display screen A and the second display screen B. Each connecting hook 1303 is rotatably connected to the corresponding one of the first display screen A and the second display screen B. Each connecting hook 1303 includes the rotation driving portion 1305, and the rotation driving portion 1305 is exposed from a frame body of the corresponding one of the first display screen A and the second display screen B. The advertising apparatus is lockably connected to another advertising apparatus by engaging the connecting hook 1303 thereof with the locking rod 1304 of another advertising apparatus to maintain a flattened configuration therebetween.

When a plurality of identical advertising apparatuses or a plurality advertising apparatuses provided with the same joints 25 are connected together, each connecting hook 1303 disposed at the left side and the right side of each of the first display screen A and the second display screen B is configured to lock onto a corresponding locking rod 1304 on either the left side or the right side of other identical advertising apparatus or one of the advertising apparatuses provided with the same joints 25, which ensures that displays of adjacent advertising apparatuses remain flat and stable when joined together.

The present disclosure further provides a third embodiment of the advertising apparatus convenient to transport, including the first display screen A, the second display screen B, and the at least one hinge 15. The first display screen A and the second display screen B are rotatably connected through the at least one hinge 15 to allow unfolding or folding with respect to each other. Each of the first display screen A and the second display screen B includes the display panel 5, the middle frame 7, the joints 25, and the side trim panels. In each of the first display screen A and the second display screen B, the joints 25 are respectively disposed on side surfaces of the middle frame 7, alignment components 17 and docking positions 1701 are respectively disposed at two sides of the middle frame 7. The alignment components 17 of the advertising apparatus is engaged with the docking positions 1701 of another advertising apparatus to achieve positioning and connection. Each of the joints 25 of the advertising apparatus is locked with a corresponding one of the joints 25 of another advertising apparatus to maintain the flattened configuration therebetween.

The alignment components 17 are ball plungers or spring pins. The docking positions 170 are grooves or holes corresponding to the ball plungers or the spring pins.

When the alignment components 17 are the spring pins, a transverse bolt is disposed at a pin shaft end of each of the spring pins. After each of the spring pins is inserted into a corresponding one of the holes for accommodating a corresponding transverse bolt, each of the spring pins is rotated 90 degrees to achieve a locking connection, which not only ensures alignment and positioning of the alignment components 17 and the docking positions 1701 but also allows the adjacent advertising apparatuses to be connected and locked together.

In the specification and claims of the present disclosure, words "include/comprise" and "with/have" and variations thereof are used to specify presence of stated features, values, steps or components, but do not exclude presence or addition of one or more other features, values, steps, components, or a combination thereof.

Some features of the present disclosure are described in different embodiments for clarity of illustration, however, these features may also be described in combination with a single embodiment. On the contrary, some features of the present disclosure are only described in a single embodiment for sake of brevity, however, these features may also be separately described or in any suitable combination in different embodiments.

The foregoing are only preferred embodiments of the present disclosure and are not intended to limit the present disclosure, and any modifications, equivalent replacements and improvements made within a spirit and principle of the present disclosure shall be included in a protection scope of the present disclosure.

What is claimed is:

1. An advertising apparatus, comprising:
a first display screen;
a second display screen;
at least one hinge; and
at least one locking component;

wherein the first display screen and the second display screen are rotatably connected through the at least one hinge to allow flattening or folding with respect to each other;

the at least one locking component comprises a connecting hook and a locking rod;

the connecting hook is rotatably connected to the first display screen;

the connecting hook comprises a rotation driving portion, and the rotation driving portion is exposed from a frame body of the first display screen;

the locking rod is disposed at the second display screen;

both the connecting hook and the locking rod are positioned at corresponding junction areas between the first display screen and the second display screen;

when the first display screen and the second display screen are rotated to a flattened state, the connecting hook at the first display screen locks the locking rod at the second display screen to maintain the first display screen and the second display screen in the flattened state;

a bottom base is disposed at one end of the second display screen opposite to the first display screen, a width of the bottom base does not exceed both widths of the first display screen and the second display screen;

the bottom base is detachably connected to the second display screen;

the bottom base comprises caster wheels at a lower end thereof;

a housing of the bottom base internally comprises a speaker, a power board, an amplifier, and a display control card;

the bottom base further comprises acoustic vents corresponding to the speaker and an interface mounting plate.

2. The advertising apparatus according to claim 1, wherein the at least one locking component further comprises a first supporting housing and a second supporting housing;

the connecting hook is disposed in an inner cavity of the first supporting housing and is rotatably connected to the first supporting housing;

the rotation driving portion is exposed from the first supporting housing;

the locking rod is disposed in an inner cavity of the second supporting housing; and mounting positions for accommodating the first supporting housing and the second supporting housing are respectively disposed at the corresponding junction areas between the first display screen and the second display screen.

3. The advertising apparatus according to claim 1, wherein the advertising apparatus further comprises at least one deployment retaining component;

when the first display screen and the second display screen are rotated to the flattened state, a first end of the at least one deployment retaining component is rotatably abutted against the first display screen, a second end of the at least one deployment retaining component is rotatably abutted against the second display screen.

4. The advertising apparatus according to claim 1, wherein the advertising apparatus further comprises at least one magnetic component, the at least one magnetic component is disposed at least one of the first display screen and the second display screen, when the first display screen and the second display screen are rotated to a folded state, the at least one magnetic component is configured to perform magnetic attraction to maintain the first display screen and the second display screen in the folded state.

5. The advertising apparatus according to claim 1, wherein each of the first display screen and the second display screen comprises a display panel, a middle frame, side trim panels, and a rear cover plate;

in each of the first display screen and the second display screen, the display panel comprises display panel units, the display panel units are assemblable and arranged on a first end surface of the middle frame, the rear cover plate is connected to a second end surface of the middle frame, the side trim panels enclose the display panel and the middle frame and are connected to side edges of the display panel and side edges of the middle frame, the middle frame comprises connecting positions, and the display panel units are detachably connected to the middle frame through corresponding connecting positions.

6. The advertising apparatus according to claim 5, wherein at least one wiring hole is defined on a frame body of the middle frame at a rotating connection side portion of each of the first display screen and the second display screen.

7. The advertising apparatus according to claim 5, wherein in each of the first display screen and the second display screen, the side trim panels are detachably connected to the middle frame, at least one mounting position for accommodating the at least one locking component respectively disposed at a left side of the middle frame or a right side of the middle frame.

8. The advertising apparatus according to claim 5, wherein in each of the first display screen and the second display screen, alignment components and docking positions matching the alignment components are respectively disposed at least one of a left side of the middle frame, a right side of the middle frame, and the corresponding junction areas between the first display screen and the second display screen.

9. The advertising apparatus according to claim 8, wherein the first alignment components and the second alignment component are ball plungers or spring pins; and the first docking positions and the second docking positions are grooves or holes corresponding to the ball plungers or the spring pins.

10. The advertising apparatus according to claim 2, wherein a damping component is disposed at a rotatable connection between the connecting hook and the first supporting housing.

11. An advertising apparatus, comprising:

a first display screen;

a second display screen;

at least one hinge; and at least one locking component;

wherein the first display screen and the second display screen are rotatably connected through the at least one hinge to allow flattening or folding with respect to each other;

the at least one locking component comprises a connecting hook and a locking rod;

the connecting hook is rotatably connected to the first display screen;

the connecting hook comprises a rotation driving portion, and the rotation driving portion is exposed from a frame body of the first display screen;

the locking rod is disposed at the second display screen;

both the connecting hook and the locking rod are positioned at corresponding junction areas between the first display screen and the second display screen;

when the first display screen and the second display screen are rotated to a flattened state, the connecting hook at the first display screen locks the locking rod at the second display screen to maintain the first display screen and the second display screen in the flattened state;

the at least one locking component further comprises a first supporting housing and a second supporting housing;

the connecting hook is disposed in an inner cavity of the first supporting housing and is rotatably connected to the first supporting housing;

a damping component is disposed at a rotatable connection between the connecting hook and the first supporting housing.

\* \* \* \* \*